(12) United States Patent
Hernandez Creus et al.

(10) Patent No.: US 10,359,452 B2
(45) Date of Patent: Jul. 23, 2019

(54) DIAGNOSTIC DEVICE, APPARATUS AND METHOD

(75) Inventors: Jordi Hernandez Creus, Granollers (ES); Marc Bautista Palacios, Barcelona (ES); Juan Luis López Rodríguez, Subirats Barcelona (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 1033 days.

(21) Appl. No.: 13/546,337

(22) Filed: Jul. 11, 2012

(65) Prior Publication Data

US 2014/0015512 A1 Jan. 16, 2014

(51) Int. Cl.
*G01R 19/165* (2006.01)

(52) U.S. Cl.
CPC .... *G01R 19/16538* (2013.01); *G01R 19/1659* (2013.01)

(58) Field of Classification Search
CPC .......... G01R 31/2801; G01R 31/2812
See application file for complete search history.

(56) References Cited

U.S. PATENT DOCUMENTS

| | | | |
|---|---|---|---|
| 4,581,552 A | 4/1986 | Womack et al. | |
| 5,498,972 A * | 3/1996 | Haulin | 324/754.03 |
| 5,894,423 A | 4/1999 | Ling et al. | |
| 5,943,205 A | 8/1999 | Erckert et al. | |
| 6,734,837 B1 * | 5/2004 | Havel | 345/83 |
| 7,400,995 B2 * | 7/2008 | Mattes et al. | 702/118 |
| 9,481,293 B2 * | 11/2016 | Honma | B60Q 1/12 |
| 2003/0086226 A1 * | 5/2003 | Hashimoto | G05F 1/575 |
| | | | 361/91.1 |
| 2005/0264472 A1 * | 12/2005 | Rast | G09G 3/14 |
| | | | 345/30 |
| 2007/0165058 A1 * | 7/2007 | Tamura et al. | 347/17 |
| 2008/0180265 A1 * | 7/2008 | Chen | G01R 19/16595 |
| | | | 340/641 |
| 2010/0308835 A1 | 12/2010 | Sekizaki et al. | |
| 2011/0121904 A1 | 5/2011 | Kojima | |
| 2011/0175699 A1 * | 7/2011 | Huss et al. | 337/143 |
| 2012/0091029 A1 * | 4/2012 | Morgan | H01M 10/48 |
| | | | 206/703 |
| 2013/0124122 A1 * | 5/2013 | Cook | H02S 50/10 |
| | | | 702/64 |

FOREIGN PATENT DOCUMENTS

WO WO2010046806 * 4/2010

OTHER PUBLICATIONS

Schrift, R.; "Digital Bus Faults Measuring Techniques"; Oct. 18-23, 1998; http://ieeexplore.ieee.org/stamp/stamp.jsp?arnumber=743177.

* cited by examiner

*Primary Examiner* — Jermele M Hollington
*Assistant Examiner* — Feba Pothen
(74) *Attorney, Agent, or Firm* — HP Inc. Patent Department

(57) ABSTRACT

A diagnostic device comprises a comparison section to compare an input voltage with a threshold voltage, wherein the input voltage is a power supply voltage for a component on a circuit board; and an indicator to provide an indication of the result of the comparison by the comparison section, the indication to render the circuit board identifiable to direct inspection, wherein the supply of power to the component is independent of the result of the comparison.

15 Claims, 6 Drawing Sheets

DIAGNOSTIC DEVICE, APPARATUS AND METHOD

BACKGROUND

The power supply to a circuit board must typically be within a certain voltage range in order to avoid damage to the components of the circuit board. If the power supply voltage goes outside of this voltage range the components of the circuit board may be damaged, with the result that the component fails to function or functions poorly.

BRIEF DESCRIPTION OF THE DRAWINGS

Examples of the invention are further described hereinafter with reference to the accompanying drawings, in which.

DETAILED DESCRIPTION

Due to modular design, industrial printers include an increasing number of circuit boards, (used herein to generically refer to printed circuit assemblies, printed circuit boards and similar components). Such circuit boards are used, for example, in printheads in carriage sub-assemblies. When an issue arises due to a damaged circuit board, it is often difficult to determine which of the circuit boards is responsible for the issue. Often a number of circuit boards that are functioning correctly will be replaced before the damaged circuit board is identified and/or replaced, leading to increased parts and labor costs.

Circuit boards are typically designed to work with a power supply voltage within a pre-defined operating range. This range may depend on the components of the circuit board and the respective maximum values specified by each manufacturer. For example, in the case of a printhead board a typical operating range is 38V to 50V (i.e. $V_{MIN}$=38 and $V_{MAX}$=50). When the power supply voltage goes outside the pre-defined range both the circuit board and the printhead may be damaged or give rise to image quality problems in a printout that are difficult to diagnose. Glitches, such as fast glitches, may occur in the power supply voltage due, for example, to electrostatic discharge or electromagnetic interference, and this may cause damage to the circuit board. The likelihood of damage from such glitches may be reduced, for example by providing a filter capacitor near the input power supply, connected to provide the board peak current and keep the power supply constant. However, such measures are not able to ensure that the power supply is always within the operating range of the circuit board, and so are not guaranteed to prevent damage to a circuit board.

Figure 1A:
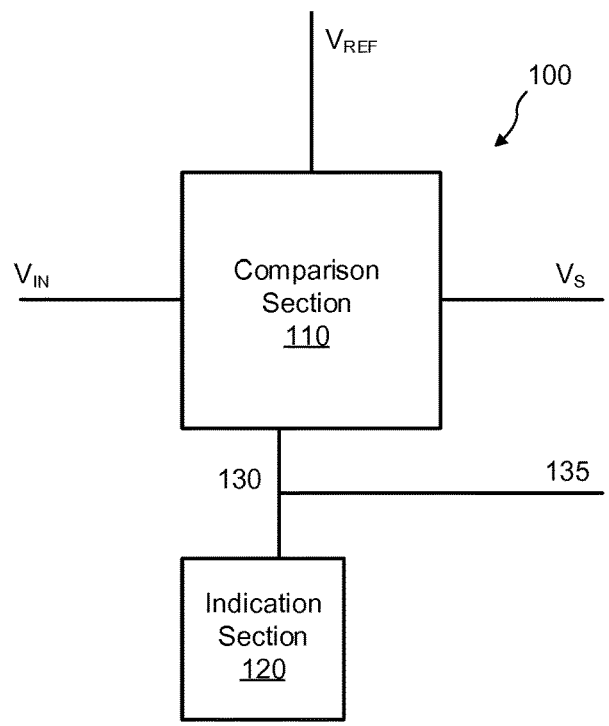
FIG. 1A illustrates a diagnostic device, according to one example.
Figure 1B:
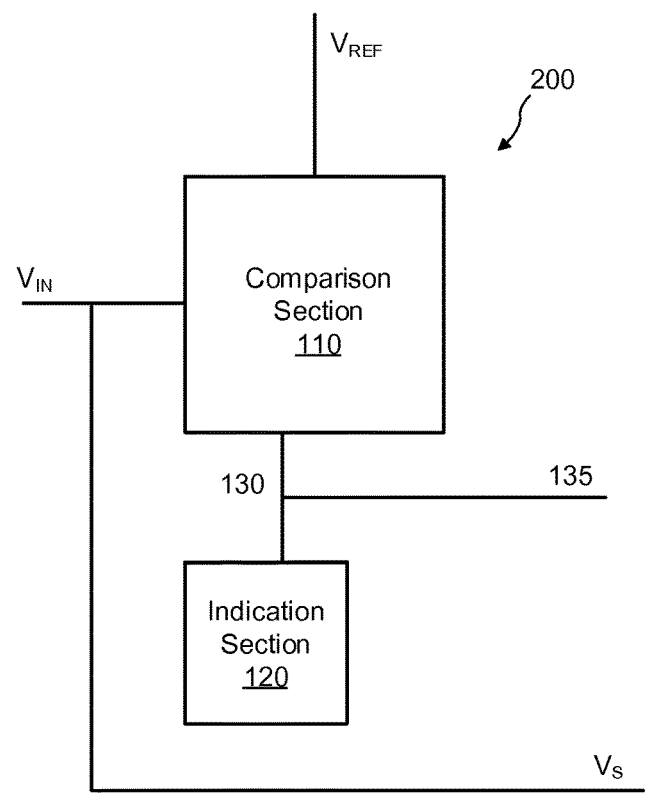
FIG. 1B illustrates a diagnostic device, according to one example.

FIG. 1A shows an example of a diagnostic device 100 for association with a circuit board. The device includes a comparison section 110 that is arranged to receive an input voltage $V_{IN}$ and compare this with a threshold voltage. In the arrangement of FIG. 1, a reference voltage $V_{REF}$ is supplied to the comparison section, and the comparison section performs the comparison between the input voltage $V_{IN}$ and the threshold voltage by comparing a voltage derived from the input voltage $V_{IN}$ and a voltage derived from the reference voltage $V_{REF}$. The comparison section compares the threshold voltage and the input voltage and, depending on the result of the comparison, outputs a signal 130 to an indication section 120. The indication section 120 is arranged to provide an indication of the result, such that the indication renders the circuit board associated with the device identifiable by visual inspection. Voltage $V_S$ is the power supply voltage for a component or components on the circuit board. $V_{IN}$ and $V_S$ may be equal or substantially equal. In some arrangements, $V_S$ is not supplied to the components of the circuit board via the diagnostic device 100, as shown in FIG. 1B.

The threshold voltage may define a maximum voltage, such that the indication section is activated when the input voltage $V_{IN}$ exceeds the threshold voltage. Alternatively, the threshold voltage may define a minimum voltage, such that the indication section is activated when the input voltage $V_{IN}$ is below the threshold voltage. In some arrangements both maximum and minimum threshold voltages may be provided, such that a range is defined and the indication section is activated when the input voltage $V_{IN}$ is outside the range. Where maximum and minimum threshold voltages are provided, the indication section may provide different indications depending on whether the input voltage $V_{IN}$ exceeds the maximum voltage or is less than the minimum voltage. In some arrangements the indication section is activated when the input voltage $V_{IN}$ is greater (less) than the maximum (minimum) threshold voltage, in other arrangements the indication section is activated when the input voltage $V_{IN}$ is greater than or equal (less than or equal) to the maximum (minimum) threshold voltage. Herein, description of the input voltage $V_{IN}$ exceeding a maximum voltage may be applied, mutatis mutandis, to the input voltage $V_{IN}$ being below a minimum voltage.

According to this arrangement, it is possible to visually identify a circuit board which has been supplied with a power supply voltage exceeding a maximum supply voltage. Such a circuit board is a strong candidate for the cause of a malfunction in the system, and can be investigated or replaced first. This leads to a reduction in time and cost associated with repairing and maintaining the printer.

Figure 2:
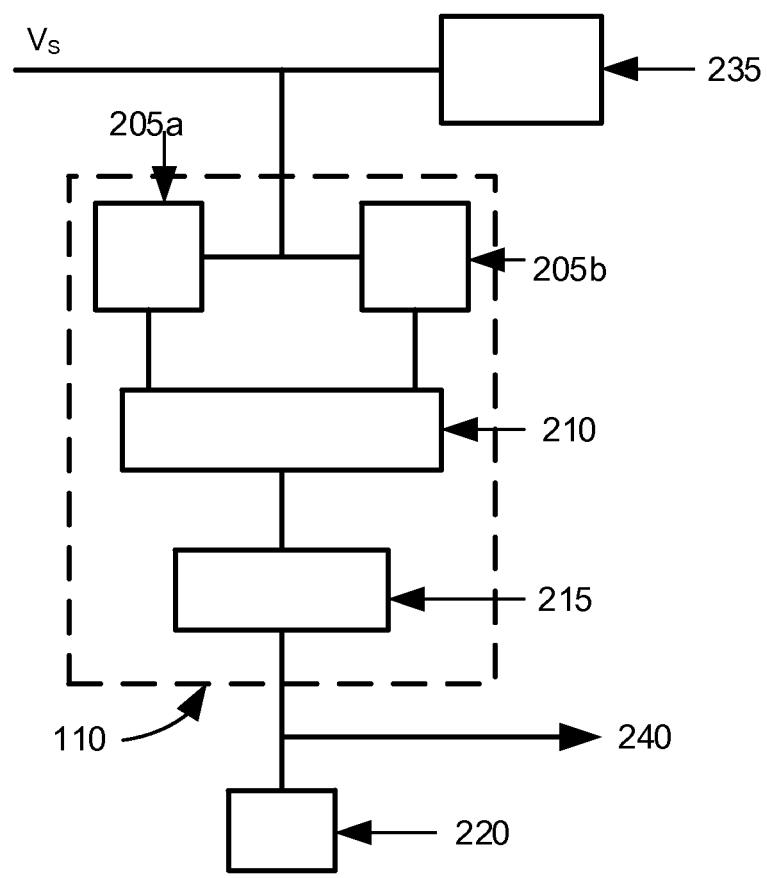
FIG. 2 illustrates a diagnostic device, according to one example.

With reference to the arrangement of FIG. 2, supply voltage $V_S$ is provided to a circuit board 235, and also supplied to an upper comparator 205a and a lower comparator 205b. The upper comparator determines whether the supply voltage $V_S$ exceeds an upper threshold (maximum voltage) and the lower comparator determines whether the supply voltage $V_S$ is below a lower threshold (minimum voltage). The respective results from the comparators 205a, 205b are provided to logic gate 210. If either of the comparators makes a positive determination (i.e. if the supply voltage $V_S$ is determined to be above the maximum threshold or below the minimum threshold) the logic gate outputs a signal to latch 215, activating light emitting diode (LED) 220. Latch 215 ensures that the LED remains activated (e.g. emitting light) independent of subsequent changes in the supply voltage $V_S$. Accordingly, if the supply voltage $V_S$ is momentarily outside the operating range of circuit board 235 and subsequently returns to within the operating range, the indicating section 120 (in this case LED 220) will remain activated (i.e. continue to provide the indication) even after the supply voltage $V_S$ has returned to the operating range. The indicating section may remain activated until it is reset (e.g. by a reset signal, cycling of the power, etc).

A result from the comparison section 110 (or an output from latch 215) may also be provided, e.g. via line 240, to a monitoring device, e.g. via a GPIO expander, microcontroller, etc on the circuit board 235. In some arrangements the monitoring device may be a processing device external to the circuit board 235, and may be external to the device (e.g. printer) in which the circuit board 235 is located.

Figure 3:
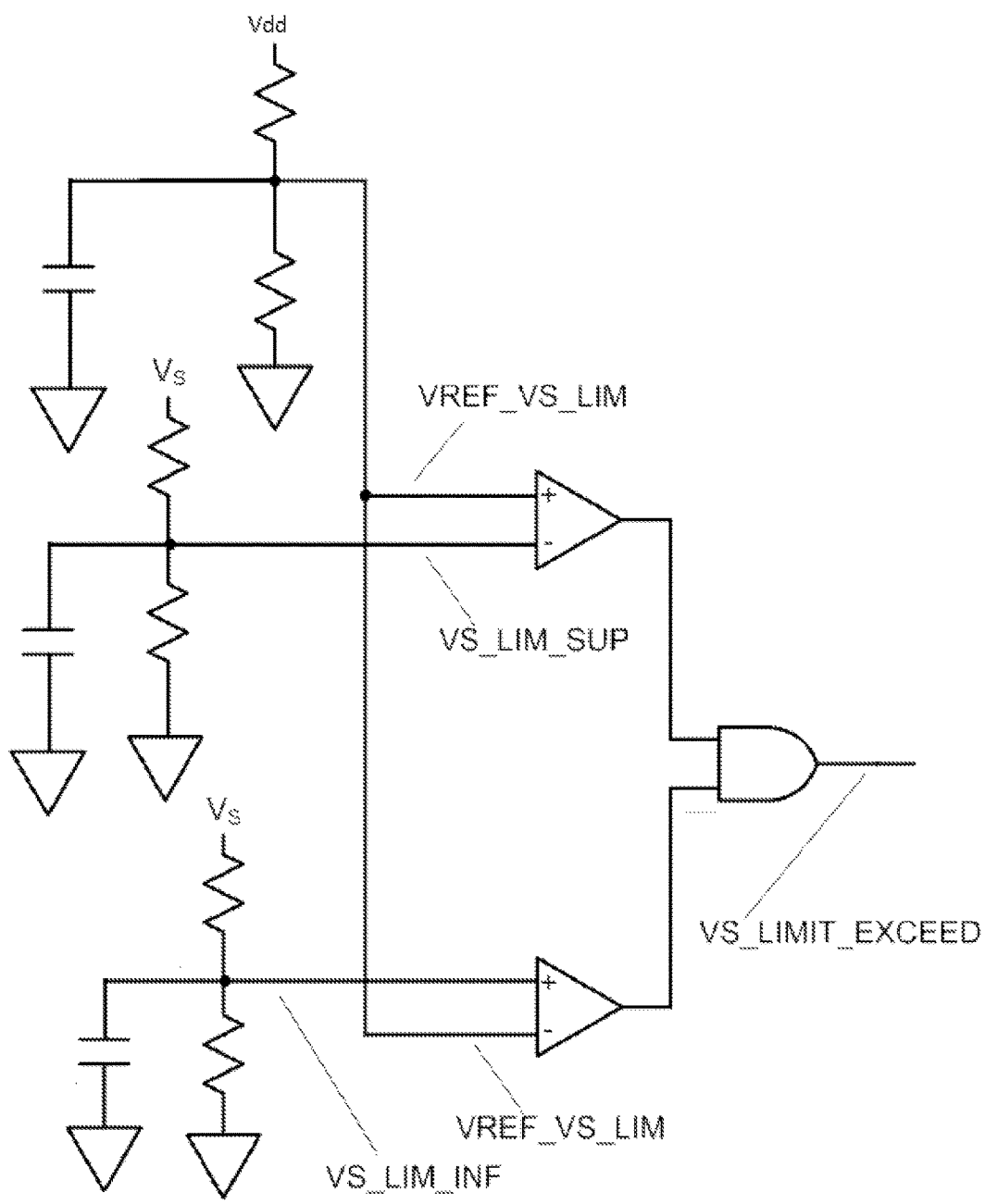
FIG. 3 illustrates a comparison section, according to one example.

With reference to FIG. 3, a diagnostic device may include two fast comparators, each receiving a respective a reference voltage (VREF_VS_LIM) and a respective voltage derived from the input voltage (VS_LIM_INF and VS_LIM_SUP). The reference voltages may be the same for both comparators (as in FIG. 3), and may be set to a value of 1.65 V, for example. Each comparator compares the reference voltage with the respective value derived from the input voltage. Accordingly, the arrangement of FIG. 3 does not perform a direct comparison between the input voltage and the threshold voltages (i.e. the maximum/minimum voltage of the operating range, $V_{MAX}$, $V_{MIN}$).

Figure 4A:
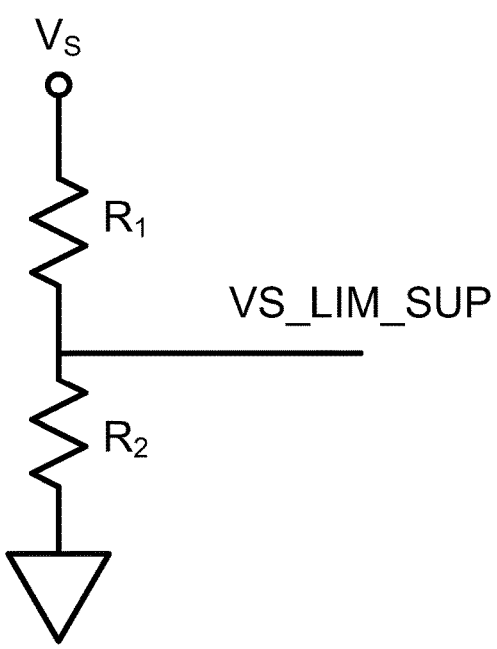
FIGS. 4A and 4B show voltage dividers used in the comparison section of FIG. 3.
Figure 4B:
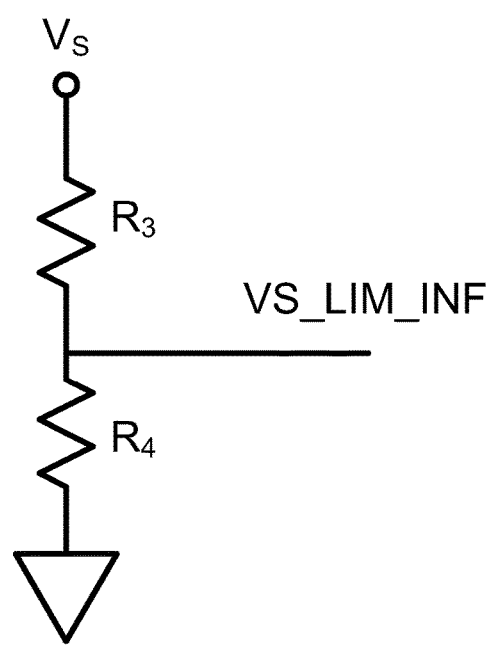

FIGS. 4A and 4B show examples of the voltage dividers of FIG. 3 that supply V_LIM_INF and V_LIM_SUP. These values, along with the value of the reference voltage (VREF_VS_LIM) determine the voltage range within which no indication will be given by the indication section 120. The diagnostic device is arranged such that the following equations hold:

$$VS\_LIM\_SUP = V_S \times R_2/(R_1+R_2), \text{ and}$$

$$VS\_LIM\_INF = V_S \times R_4/(R_3+R_4)$$

If $Vm_{MAX}$ and $V_{MIN}$ are the maximum and minimum operating voltages of the circuit board, respectively, then when $V_S=V_{MAX}$, VS_LIM_SUP=VREF_VS_LIM. Similarly, when $V_S=V_{MIN}$, VS_LIM_INF=VREF_VS_LIM.

The voltage divider of FIG. 4A produces VS_LIM_SUP, which is representative of $V_S$, such that if $V_S$ exceeds $V_{MAX}$, VS_LIM_SUP will exceed VREF_VS_LIM. Similarly, the voltage divider of FIG. 4B provides VS_LIM_INF, which is representative of $V_S$ such that if $V_S$ is below $V_{MIN}$, VS_LIM_INF will be below VREF_VS_LIM.

As shown in FIG. 3, the comparators compare VS_LIM_SUP and VS_LIM_INF, respectively with VREF_VS_LIM. IF $V_S$ goes above $V_{MAX}$ or below $V_{MIN}$ the respective comparator asserts '0' logic. The output of the comparators is supplied to an AND gate, such that if either comparator asserts '0' logic, the AND gate will assert '0' logic, corresponding to a VS_LIMIT_EXCEED signal. The assertion of '0' logic by the AND gate causes the indication section 120 to activate to perform an indication, such as turning on a LED 220. A latch 215 may be provided to keep the indication section in an ON state following an assertion of logic '0' by the AND gate (i.e. in response to a VS_LIMIT_ EXCEED signal) in order to inform a user of the voltage glitch after the supply voltage has returned to a normal operating level. The latch may be arranged to keep the indication section 120 active until it is reset, e.g. by the printer. The output of the latch may also be provided to a GPIO expander or any other device on the circuit board. In some examples, the latch may be a J-K latch.

Figure 5:
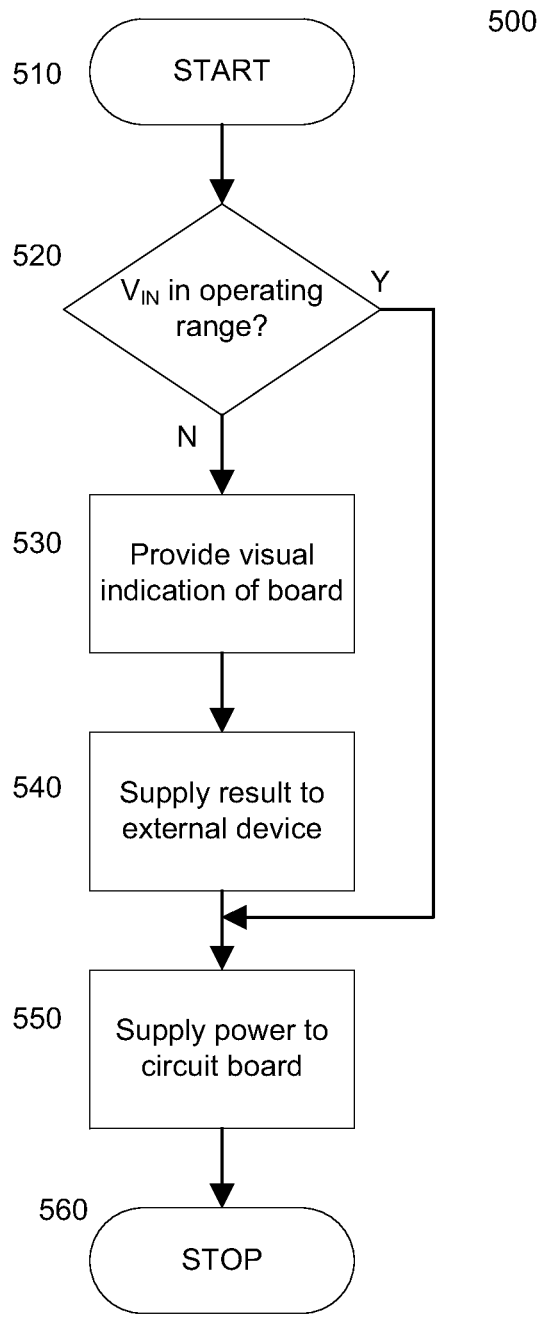
FIG. 5 shows a method performed by a diagnostic device, according to one example.

FIG. 5 illustrates a method 500 performed by a diagnostic device. The method begins at 510 and at 520 it is determined (e.g. using comparators as described above) whether or not the input voltage is within the normal operating range. When the input voltage is within the normal operating range, the method advances to 550. Otherwise, at 530 a visual indication of the board is provided. The result may also be provided to an external device or processor at 540. Power is supplied to the circuit board throughout the method, but is specifically identified at 550. The method ends at 560, although the method may also loop back to 520, for example during the time that power is supplied.

Figure 6:
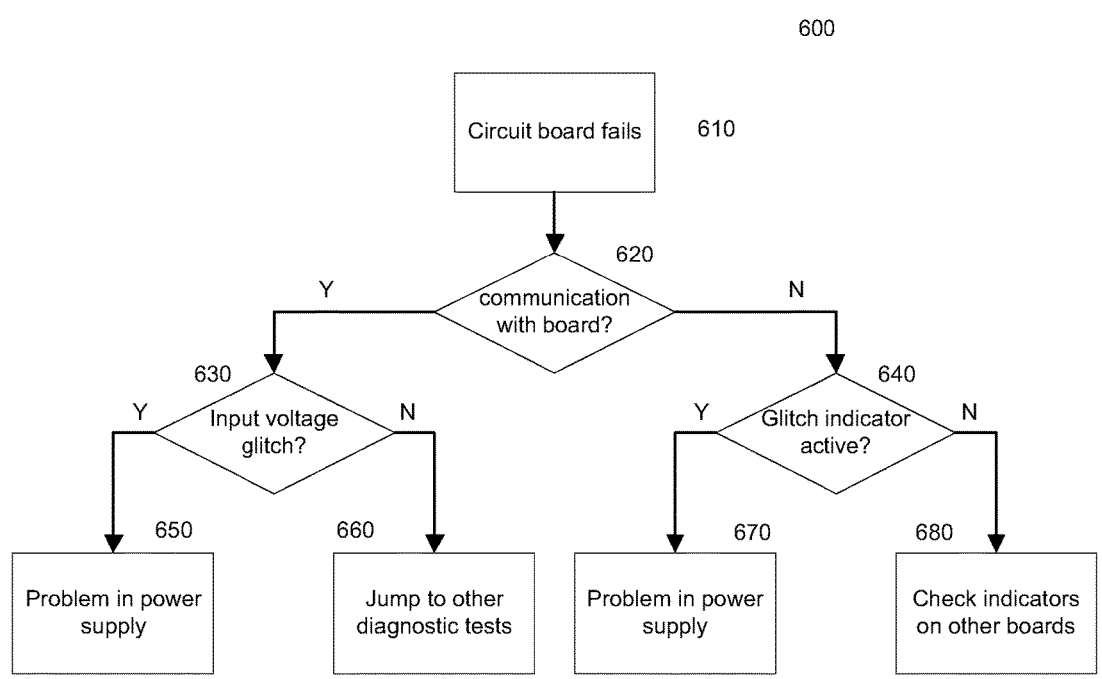
FIG. 6 shows a diagnostic method, according to one example.

FIG. 6 shows a diagnostic flow 600 to be followed by a user according to some examples. At 610 the circuit board fails. This may be detected by a user noticing that the device is not operating correctly. In some examples, the user may be alerted to a problem with the device by an automated monitoring system.

The user or monitoring system determines, at 620, whether the circuit board is in communication with the monitoring system. For example, the monitoring system may be a separate device (such as an external computer) or may be integrated into the device (e.g. printer) containing the circuit board. If there is communication with the circuit board, the user or the monitoring system determines whether a glitch in an input voltage has been detected. Positive detection indicates a problem in the power supply 650. On the other hand, in response to a negative detection, further diagnostic tests may be performed 660.

Where there is no communication with the board at 620, the user visually inspects the circuit board at 640. Where the indication section 120 is providing a visual indication, this indicates that a glitch has occurred in the power supply to the board, and suggests a problem with the power supply 670. If the indication section 120 is not providing an indication of the circuit board, the user may check indication sections on other boards 660 or proceed to other tests.

According to the above method, the user may efficiently determine which, if any, circuit board has received a glitch in its power supply, even when the circuit board is not in communication with a monitoring section. This allows a circuit board to be readily identified that is a good candidate for the cause of any problems.

The diagnostic device described above may be combined with preventative measures, such as a filter capacitor, such that glitches in the supply voltage are prevented from reaching components on the circuit board. The diagnostic device may be provided to assist in repair in the event the glitch is not prevented by the filter capacitor (or other preventative measure). Where the diagnostic device is provided between the preventative measure and the (other) components on the circuit board, the input voltage to the diagnostic device $V_{IN}$ is representative of the voltage $V_S$ supplied to the components on the circuit board, i.e. after the effect of the preventative measure. This improves the accuracy of the indication provided by the diagnostic device.

Indication section 120 may be provided on the circuit board or integrated with the circuit board. In some examples the indication section is located in the region of the circuit board. The indication section is arranged to provide an indication that identifies the associated circuit board when the circuit board or its immediate vicinity is inspected visually.

FIG. 2 shows latch 215 as part of the comparison section 110, but in some arrangements latch 215 could instead be considered to be part of the indication section 120. In still other arrangements the latch 215 could be separate from both the comparison section 110 and the indicating section 120. Other arrangements could be used in place of a latch to keep the indicating section in an activated state following a detection of a supply voltage $V_S$ outside the operating range. In some cases the nature of the indication section may make a latch unnecessary.

In the arrangement of FIG. 3, the threshold voltage (e.g. maximum or minimum voltage) is not compared directly with the input voltage, however, such arrangements are possible.

FIG. 3 includes an AND Gate. However, other arrangements are possible. For example, an OR gate could be used with suitable adjustment to the inputs of the comparators. FIG. 3 illustrates an arrangement in which a positive indication corresponds with VS_LIMIT_EXCEED having logic '0', but in other arrangements a positive indication could be associated with VS_ LIMIT_ EXCEED having logic '1'. Other arrangements with the same or similar functionality could also be used. In some arrangements no gate is required. For example, independent indications may be provided for the outputs of each of the comparators. The output of each comparator may be provided directly to a respective indication section.

The indication section 120 may include an LED that illuminates in response to detection of a glitch voltage. Other visual indications may also be provided, for example a mechanical component that alters its visual appearance in response to detection of a glitch voltage could be used. Herein the indication section has been described as activating in response to detection of a glitch, however, the indication section may normally be in an activated state, and may deactivate in response to a detection of a glitch.

In some arrangements a visual indication may be replaced or augmented by some other form of indication (e.g. an acoustic indication). For example, the indication section 120 may include a buzzer. Thus in some examples the indication section 120 may render the circuit board identifiable to direct inspection. Direct inspection may include, for example, looking at or proximal to the circuit board, or listening to an audible signal emitted by a component on the circuit board or located proximal to the circuit board.

Herein, references to features being independent of $V_S$ include arrangements in which the features are substantially independent of $V_S$. For example, in some arrangements the indication section 120 remains activated following a glitch detection, independent of subsequent values of $V_S$ (e.g. if $V_S$ returns to the normal operating range). However, where the device is powered off (i.e. $V_S$=0) the indication section may become deactivated. In such an arrangement the indicating section, following a glitch detection, is substantially independent of $V_S$, and is considered to be independent of $V_S$ for the of the disclosure.

The forgoing description has been made with reference to printers, and to a printhead board of a printer. However, the examples described above may be applied to any device or application in which diagnosis of faults associated with circuit boards is to be performed, particularly in devices or applications making use of a plurality of circuit boards.

The description of functional blocks herein is not particularly limiting on the components employed to achieve the disclosed functions. For example, components may combine and/or be spread across a more than one functional unit.

In some examples $V_{IN}$, which is supplied to the comparison section 110 is the same as the supply voltage $V_S$. In other examples, $V_{IN}$ may be different from, but representative of the supply voltage $V_S$.

Herein, references to supplying a supply voltage, $V_S$, to components on a circuit board do not necessarily require a single component to be supplied with $V_S$. For example, the supply voltage may be divided prior to being supplied to components on the circuit board.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers or characteristics described in conjunction with a particular aspect or example of the invention are to be understood to be applicable to any other aspect or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing examples.

What is claimed:

1. A diagnostic device comprising:
    a main power supply line onto a printhead circuit board of a printer, the power supply line to receive a power supply voltage from off the circuit board;
    a comparison section to compare the power supply voltage with a threshold voltage, the comparison section detecting an overvoltage condition on the power supply line; and
    an audio or visual indicator mounted to the circuit board to provide an indication to a technician of the overvoltage condition on the power supply line,
    wherein power continues to be supplied to components on the circuit board after the overvoltage condition is detected and wherein the indicator remains activated independent of subsequent values of the power supply voltage.

2. A diagnostic device according to claim 1, further comprising a communication section to communicate detection of an overvoltage condition on the power supply line by the comparison section to a processor device external to the circuit board.

3. A diagnostic device according to claim 1, further comprising a communication section to communicate detection of an overvoltage condition on the power supply line by the comparison section to a processor device internal to the circuit board.

4. A diagnostic device according to claim 1, wherein the indicator provides a visual indication.

5. A diagnostic device according to claim 1, wherein the indicator is to illuminate in response to detection of the overvoltage condition on the power supply line.

6. A diagnostic device according to claim 1, wherein the indicator provides an audible indication to a location of the component.

7. A diagnostic device according to claim 1, wherein the comparison section includes a comparator to compare the power supply voltage and the threshold voltage, and to output a signal based on the comparison.

8. A diagnostic device according to claim 7, wherein the comparison section further includes a second comparator to compare the power supply voltage and a further threshold voltage, and output a further output signal based on the comparison, the second comparator detecting an under voltage condition on the power supply line during operation.

9. A diagnostic device according to claim 8, wherein the comparison section includes an AND gate to receive the output and the further output and provide a result to the indicator.

10. An apparatus comprising:
a plurality of circuit boards, each circuit board comprising:
  a principle power supply line receiving an input voltage from off the circuit board;
  a comparison section to compare the input voltage with a threshold voltage, and detect an overvoltage condition on the power supply line; and
  an audio or visual indicator mounted to the circuit board to provide an indication to a technician when the comparison section detects the overvoltage condition on the power supply line,
wherein the supply of power to components on the circuit board is independent of the result of the comparison and continues after provision of the indicator,
wherein the apparatus is a printer and the plurality of circuit boards include a printhead board.

11. A diagnostic method, comprising:
detecting an overvoltage condition on a power supply voltage on a printhead board of a printer by comparing the power supply voltage with a threshold voltage, wherein the threshold voltage is greater than 50 volts;
providing an alert to a user using an automated monitoring system;
providing an audio or visual indication on the printhead circuit board indicating detection of the overvoltage condition, wherein the indication continues independent of subsequent voltages of the power supply voltage due to operation of a latch on the printhead circuit board; and
continuing to provide the power supply voltage to components on the printhead circuit board while the indicator indicates the occurrence of the overvoltage condition wherein the power supply voltage is 38 volts to 50 volts.

12. The method of claim 11, further comprising communicating a result of the comparison to a processing section external to the circuit board.

13. The method of claim 11, further comprising communicating a result of the comparison to a processing section internal to the circuit board.

14. A diagnostic device according to claim 1, wherein the indicator can be reset by cycling power to the circuit board.

15. A diagnostic device according to claim 8, further comprising a voltage divider that receives a reference voltage and uses the reference voltage to determine the threshold voltage.

* * * * *